(12) United States Patent
Zhang

(10) Patent No.: US 9,871,440 B2
(45) Date of Patent: Jan. 16, 2018

(54) INTERNAL POWER SUPPLY CIRCUIT AND SEMICONDUCTOR DEVICE

(71) Applicant: FUJI ELECTRIC CO., LTD., Kawasaki-shi, Kanagawa (JP)

(72) Inventor: Yanzheng Zhang, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/447,076

(22) Filed: Mar. 1, 2017

(65) Prior Publication Data

US 2017/0179820 A1 Jun. 22, 2017

Related U.S. Application Data

(63) Continuation of application No. PCT/JP2016/051008, filed on Jan. 14, 2016.

(30) Foreign Application Priority Data

Mar. 11, 2015 (JP) .................. 2015-048238

(51) Int. Cl.
*G05F 1/56* (2006.01)
*G05F 3/18* (2006.01)
*H02M 3/156* (2006.01)
*H02M 3/07* (2006.01)
*H03K 5/08* (2006.01)
*G05F 1/569* (2006.01)
*G05F 1/46* (2006.01)

(52) U.S. Cl.
CPC .............. *H02M 3/07* (2013.01); *G05F 1/465* (2013.01); *G05F 1/569* (2013.01); *G05F 3/185* (2013.01); *H02M 3/156* (2013.01); *H03K 5/08* (2013.01)

(58) Field of Classification Search
CPC ... G05F 1/46; G05F 1/465; G05F 1/56; G05F 1/565; G05F 1/569; G05F 3/18; G05F 3/185; H02M 3/156; H02M 3/158; H03K 5/08

See application file for complete search history.

(56) References Cited

U.S. PATENT DOCUMENTS 5,757,628 A * 5/1998 Kamata .................. H02M 1/12
361/40
5,942,933 A 8/1999 Yang
(Continued)

FOREIGN PATENT DOCUMENTS

JP H09-271165 A 10/1997
JP H11-202955 A 7/1999
(Continued)

*Primary Examiner* — Patrick O'Neill
(74) *Attorney, Agent, or Firm* — Rabin & Berdo, P.C.

(57) ABSTRACT

A control switch is connected to a power supply voltage and turns on based on a control signal to output a current. A clamp circuit is connected to a load and performs clamp control of the output voltage of the control switch. A current control element conducts or shuts off a current based on the output voltage to be clamp-controlled. A selector switch group includes switches, and performs switching based on a voltage varying with the current control by the current control element, thereby switching between paths for generating an internal power supply. The switch circuit connects or disconnects the coupling between the clamp circuit and the selector switch group.

5 Claims, 11 Drawing Sheets

(56) References Cited

U.S. PATENT DOCUMENTS

2012/0049632 A1    3/2012  Sato et al.
2016/0181792 A1*  6/2016  Iwamizu ............ H03K 17/0822
                                                  361/93.9

FOREIGN PATENT DOCUMENTS

| JP | 2009-124931 A | 6/2009 |
| JP | 2010-220351 A | 9/2010 |
| JP | 2012-050208 A | 3/2012 |
| JP | 2016046543 A * | 4/2016 |

* cited by examiner

GENERATION OF INTERNAL POWER SUPPLY VDD
THROUGH PATH L1

GENERATION OF INTERNAL POWER SUPPLY VDD
THROUGH PATH L2

INTERNAL POWER SUPPLY CIRCUIT AND SEMICONDUCTOR DEVICE

CROSS-REFERENCE TO RELATED APPLICATION

This application is a continuation application of International Application PCT/JP2016/051008 filed on Jan. 14, 2016 which designated the U.S., which claims priority to Japanese Patent Application No. 2015-048238, filed on Mar. 11, 2015, the entire contents of which are incorporated herein by reference.

BACKGROUND OF THE INVENTION

1. Field of the Invention

The present technology relates to internal power supply circuits and semiconductor devices.

2. Background of the Related Art

In recent years, a semiconductor device, called an IPS (Intelligent Power Switch) is under development, which is obtained by integrating, into one chip, a switch element using a power semiconductor element, a driver circuit for the switch element, its peripheral control circuit, its protection circuit, and the like.

The IPS is widely utilized in vehicle electric systems, for example, such as a transmission, an engine, and a brake, and thus products achieving smaller size, higher performance, and higher reliability are desired.

As the conventional technique, there is proposed a technique of stabilizing the operation of a switch circuit by connecting an RC filter formed of a resistor and a capacitor between a frame ground and one end of a series circuit including the primary winding of a transformer and a switching element (Japanese Laid-open Patent Publication No. 09-271165).

The power supply environment of a vehicle is not good as compared with that of an ordinary home or the like, and in such an environment a high voltage, a low voltage, and/or instantaneous interruption, such as a counter-electromotive force and/or a spike, are likely to be generated. Therefore, in the IPS, an appropriate power supply control is carried out. For example, an external power supply voltage is not directly supplied to a predetermined circuit, but an internal power supply generated inside a device is supplied thereto.

Specifically, the IPS supplies a power by stepwisely increasing the voltage value of an internal power supply, such that during initial operation, the internal power supply having a voltage value lower than a power supply voltage is supplied and then after a predetermined time has elapsed, the internal power supply having the same level of voltage as the power supply voltage is supplied, and thus achieving the stabilized startup of a circuit.

However, a conventional IPS, when an abnormal current is generated, for example, due to the noise superimposed on a transmission line connected to a load, sometimes fails to normally increase the internal power supply up to a specified level.

If the internal power supply does not reach a specified level of voltage during circuit operation, then a switch for actuating a load is not able to be successfully driven, for example, due to the generation of a leakage current, thus causing a problem that a circuit malfunctions.

SUMMARY OF THE INVENTION

In one aspect of the embodiments, there is provided an internal power supply circuit which generates an internal power supply from a power supply voltage, the internal power supply circuit including: a control switch which is connected to the power supply voltage and turns on based on a control signal to output a current; a clamp circuit which is connected to a load and carries out clamp control of an output voltage of the control switch; a current control element which conducts or shuts off the current in accordance with the output voltage to be clamp-controlled; a selector switch group which performs switching between paths for generating the internal power supply, based on an application of a voltage varying with conduction or shut off of the current; and a switch circuit which connects or disconnects a coupling between the clamp circuit and the selector switch group.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1A:
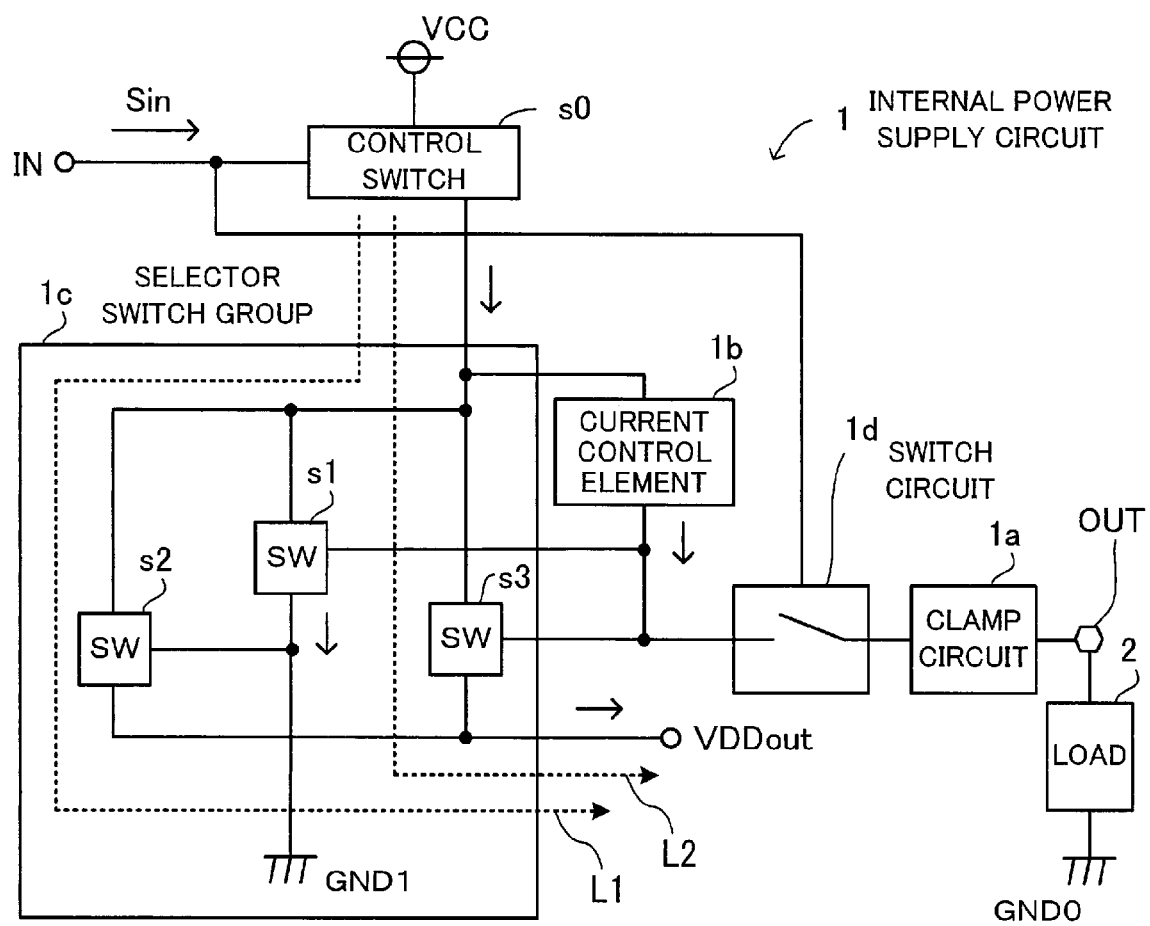
FIG. 1A illustrates a configuration example of an internal power supply circuit.

Hereinafter, embodiments disclosed herein will be described with reference to the accompanying drawings. Note that, in this specification and the attached drawings, an element having substantially the same function may be given the same reference numeral to omit the duplicated description.

FIG. 1A illustrates a configuration example of an internal power supply circuit. An internal power supply circuit 1 includes a control switch s0, a clamp circuit 1a, a current control element 1b, a selector switch group 1c, and a switch circuit 1d. Moreover, the selector switch group 1c includes, as a three-terminal switch, a switch s1 (first switch), a switch s2 (second switch), and a switch s3 (third switch).

An input terminal IN is connected to an input end of the control switch s0 and one input end of the switch circuit 1d. A current output end of the control switch s0 is connected to one input ends of the switches s1, s2, and s3 and an input end of the current control element 1b.

An output end of the current control element 1b is connected to the other input ends of the switches s1 and s3 and the other input end of the switch circuit 1d. An output end of the switch s1 is connected to the other input end of the switch s2 and an internal ground GND1, and output ends of the switches s2 and s3 are connected to an internal power supply output terminal VDDout.

An output end of the switch circuit 1d is connected to the input end of the clamp circuit 1a, an output end of the clamp circuit 1a is connected to one end of a load 2 via an output terminal OUT, and the other end of the load 2 is connected to an external ground GND0.

Here, the control switch s0 is connected to a power supply voltage VCC, and is turned on based on a control signal Sin to output a current. The clamp circuit 1a is connected to the load 2, and also carries out clamp control of the output voltage of the control switch s0.

The current control element 1b conducts or shuts off the current in accordance with the output voltage to be clamp-controlled. The selector switch group 1c performs switching between a path L1 (first path) and path L2 (second path) for generating an internal power supply, based on application of a voltage varying with the conduction or shut-off of the current to the switches s1 to s3. The switch circuit 1d connects or disconnects a coupling between the clamp circuit 1a and the selector switch group 1c.

Figure 1B:
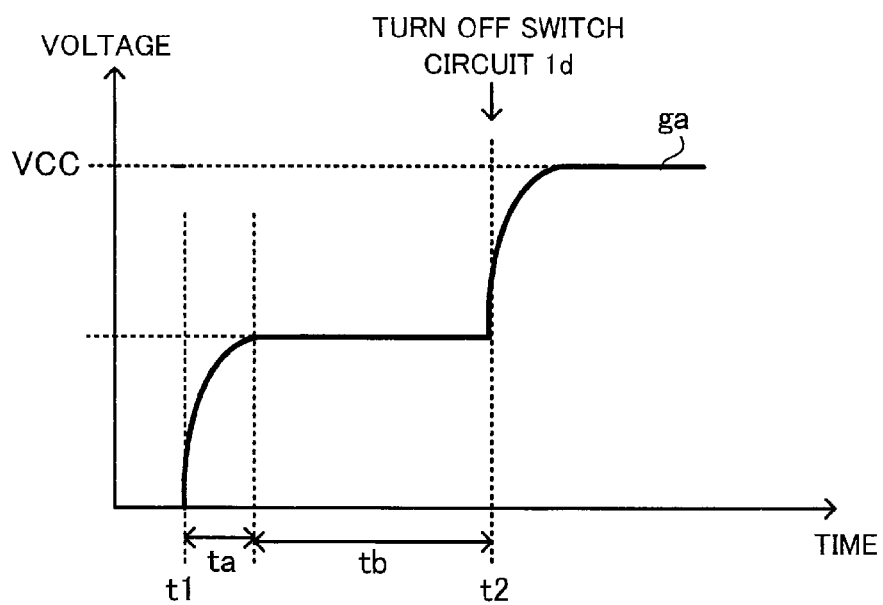
FIG. 1B illustrates the operation.

FIG. 1B illustrates the operation of the internal power supply circuit. The vertical axis represents voltage while the horizontal axis represents time. A graph ga illustrates the waveform of an internal power supply generated by the internal power supply circuit 1.

In a time zone ta, an internal power supply through the path L1 is generated and rises. On the other hand, when an abnormal current is generated on a transmission line connected to the load 2 due to noise or the like, a period will be maintained during which the internal power supply does not rise, as illustrated in a time zone tb.

For such phenomenon, in the internal power supply circuit 1, the switch circuit 1d turns off at a time instance t2 after a predetermined time has elapsed from start of switch-on (time instance t1) of the control switch s0. The switch circuit 1d turns off to disconnect the coupling between the clamp circuit 1a and the selector switch group 1c, so that the internal power supply through the path L1 is generated again.

Therefore, as illustrated at a time instance t2 and thereafter, the internal power supply is normally increased up to the power supply voltage VCC. Thus, the generation of a leakage current is suppressed, and also a malfunction of a peripheral circuit is prevented.

Next, before description of the detail of a technique of the embodiments, the configuration of an internal power supply circuit without the function of the embodiments and its problem will be described. Note that, the external ground will be hereinafter simply referred to as GND0 while the internal ground will be simply referred to as GND1.

Figure 2:
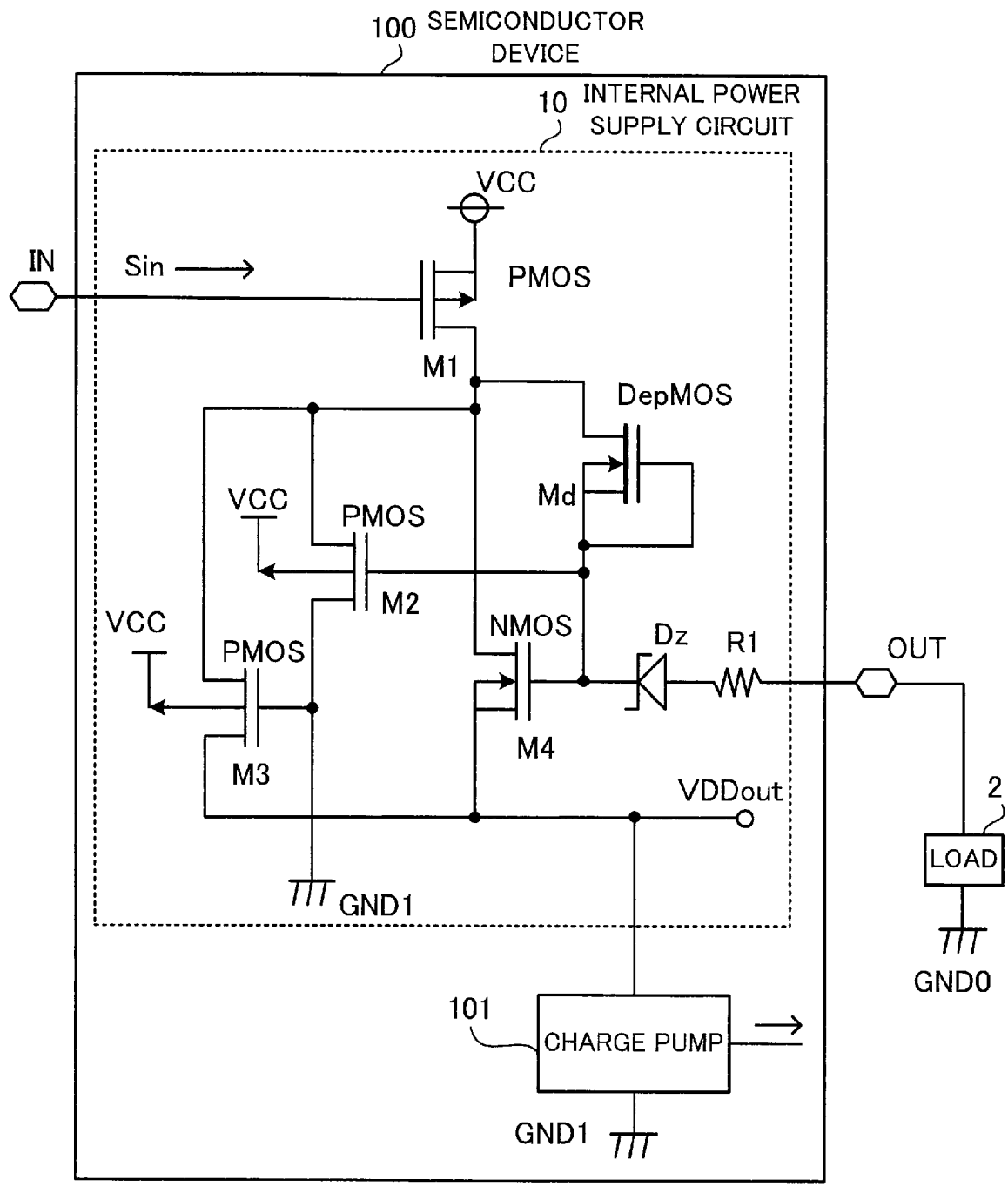
FIG. 2 illustrates a configuration example of a semiconductor device.

FIG. 2 illustrates a configuration example of a semiconductor device. A semiconductor device 100 includes an internal power supply circuit 10 and a charge pump 101, and is connected to the load 2.

The internal power supply circuit 10 includes PMOS transistors M1 to M3 which are P-channel MOSFETs (Metal Oxide Semiconductor Field Effect Transistors), an NMOS transistor M4 which is an N-channel MOSFET, a depletion MOS transistor Md which is a depletion type MOSFET, a Zener diode Dz, and a resistor R1.

The depletion MOS transistor Md is a depletion type MOSFET, and is a transistor in which a current flows between the drain and source when the gate voltage is 0 V. The depletion MOS transistor Md is used as a current source. Note that the PMOS transistors M1 to M3 and NMOS transistor M4 are enhancement type MOSFETs.

Regarding the relation of connection among the respective circuit elements, the source of the PMOS transistor M1 is connected to the power supply voltage VCC, while the gate of the PMOS transistor M1 is connected to the input terminal IN. The drain of the PMOS transistor M1 is connected to the drain of the depletion MOS transistor Md, the drain of the NMOS transistor M4, the source of the PMOS transistor M2, and the source of the PMOS transistor M3.

The gate of the depletion MOS transistor Md is connected to the source of the depletion MOS transistor Md, the gate of the NMOS transistor M4, the cathode of the Zener diode Dz, and the gate of the PMOS transistor M2.

The drain of the PMOS transistor M2 is connected to the gate of the PMOS transistor M3 and GND1. The back-gate of the PMOS transistor M2 is connected to the power supply voltage VCC, and the back-gate of the PMOS transistor M3 is connected to the power supply voltage VCC.

The drain of the PMOS transistor M3 is connected to the source of the NMOS transistor M4, the internal power supply output terminal VDDout, and one power supply terminal of the charge pump 101. The anode of the Zener diode Dz is connected to one end of the resistor R1, and the other end of the resistor R1 is connected to one end of the load 2 via the output terminal OUT.

The other power supply terminal of the charge pump 101 is connected to GND1, and the other end of the load 2 is connected to GND0. Note that, from the output end of the charge pump 101, a boosted voltage signal is output toward a predetermined circuit. This voltage signal serves, for example, as a switch control signal when turning on/off a main switch (not illustrated) for driving the load 2.

Here, VCC in the view is an external power supply voltage, and is 13 V, for example. Moreover, GND0 is the ordinary ground of 0 V. Furthermore, GND1 is different from GND0, and becomes 0 V when the semiconductor device 100 is not operating, while when the semiconductor device 100 is operating, it becomes a value obtained by subtracting a predetermined value (e.g., 5 V) from VCC, for example.

Furthermore, the input terminal IN is a terminal to receive an input signal Sin for turning on/off the internal power supply circuit 10. The output terminal OUT is an output terminal to which the load 2 is connected.

Moreover, the internal power supply output terminal VDDout is the terminal for outputting the internal power supply VDD which the internal power supply circuit 10 generates from the external power supply VCC. The internal power supply VDD and GND1 are supplied as the operating power supply for a peripheral circuit.

Next, the operation at the normal time of the internal power supply circuit 10 will be described. The internal power supply circuit 10 generates the internal power supply VDD through two paths from the power supply voltage VCC. Moreover, the internal power supply circuit 10 is driven when the input signal Sin is at an L level, while when the input signal Sin is at an H level, it is not driven.

Figure 3:
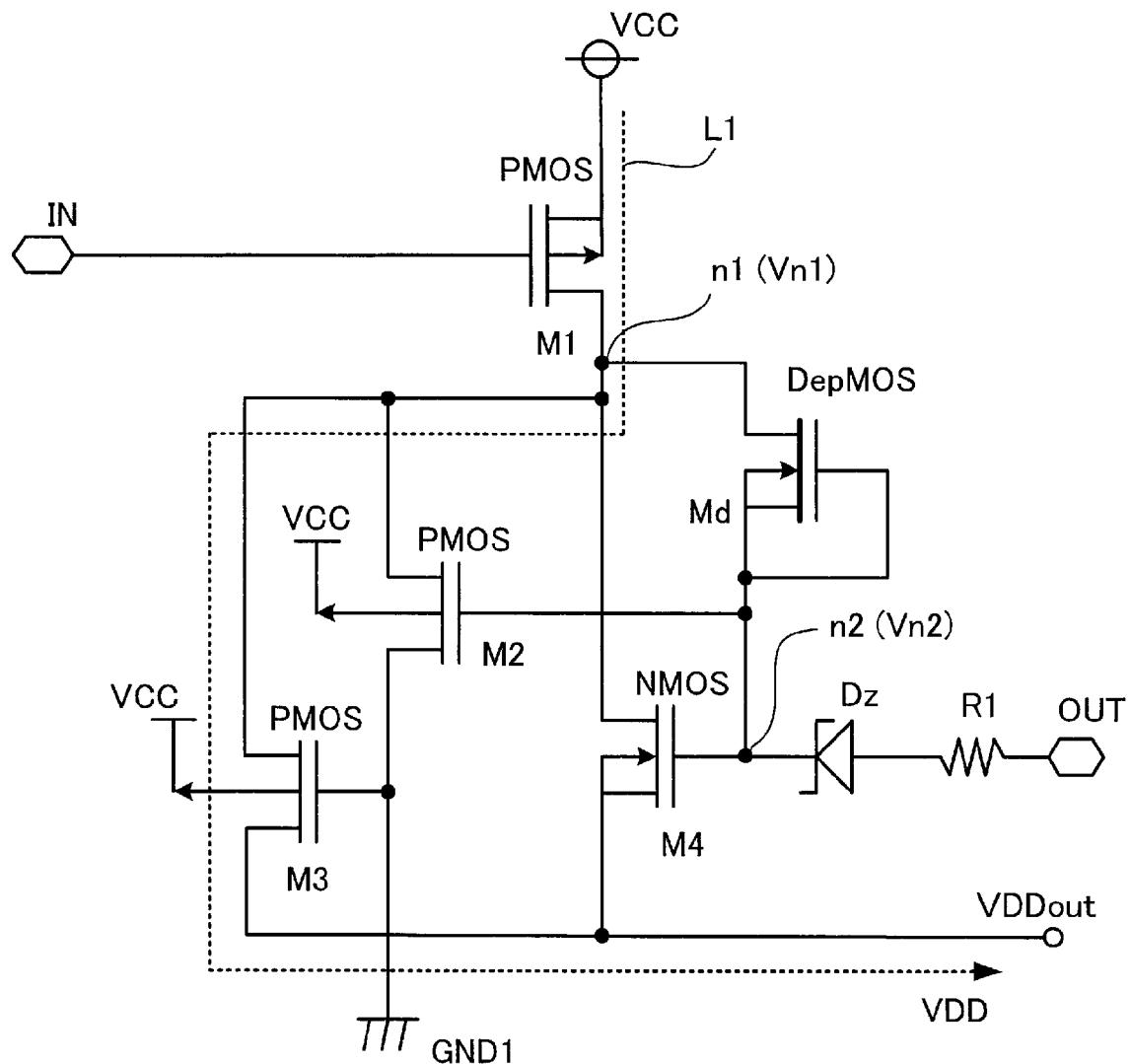
FIG. 3 illustrates one path when the internal power supply circuit generates a power supply.

FIG. 3 illustrates one path when the internal power supply is generated. A path L1 is the path via the PMOS transistor M3, and is the path for generating the internal power supply VDD with substantially no voltage drop from the power supply voltage VCC.

Figure 4:
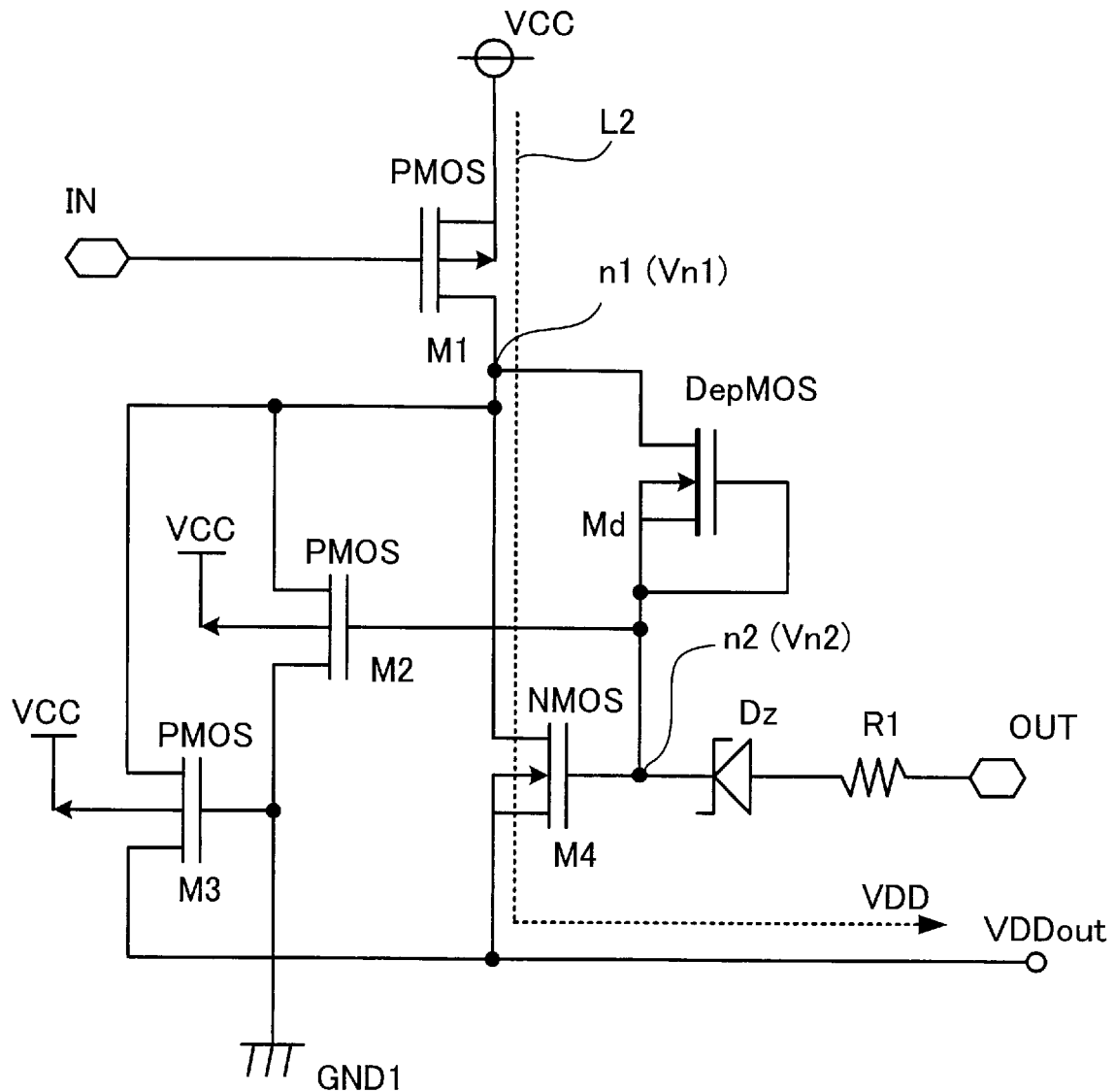
FIG. 4 illustrates another path when the internal power supply circuit generates a power supply.

FIG. 4 illustrates another path when the internal power supply is generated. A path L2 is the path via the NMOS transistor M4 functioning as a source follower.

In the path L2, a voltage value lower than the power supply voltage VCC by the threshold voltage of the NMOS transistor M4 is generated as the internal power supply VDD. This prevents the high power supply voltage VCC from being directly applied to a peripheral circuit during initial operation.

Figure 5:
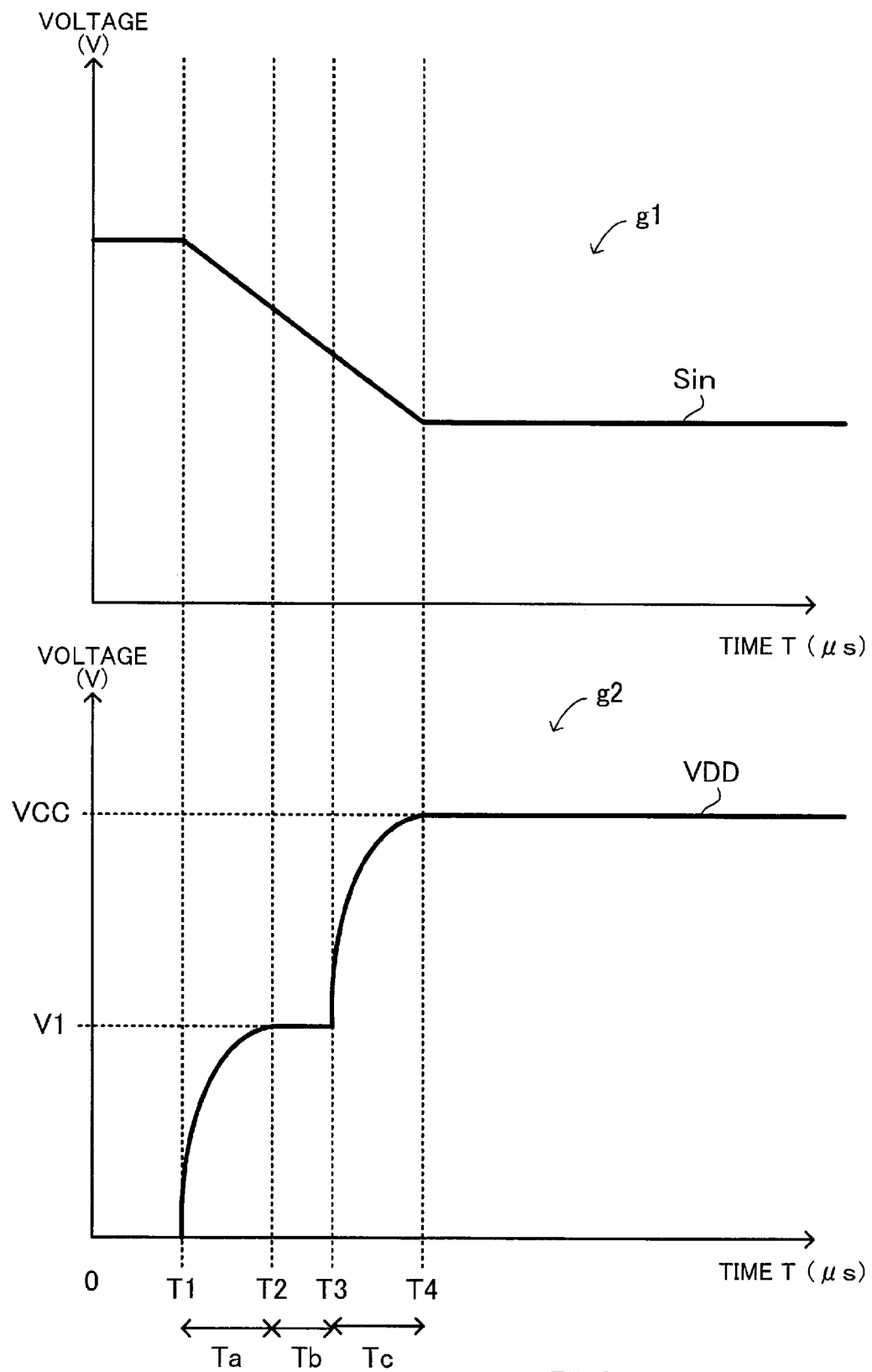
FIG. 5 illustrates a change in the waveform of the internal power supply.

FIG. 5 illustrates a change in the waveform of the internal power supply, and illustrates operation waveforms at the normal time of the internal power supply circuit 10.

A graph g1 illustrates the waveform of the input signal Sin. The vertical axis represents voltage (V) of the input signal Sin, while the horizontal axis represents time T (μs).

Moreover, a graph g2 illustrates the waveform of the internal power supply VDD output from the internal power supply output terminal VDDout. The vertical axis represents voltage (V) of the internal power supply VDD, while the horizontal axis represents time T (μs).

[$0 \leq T < T1$] The input signal Sin is at an H level. Accordingly, the PMOS transistor M1 is turned off. Therefore, the internal power supply VDD is 0 V because the internal power supply circuit 10 is not driven.

[$T1 \leq T < T2$] A period Ta is a time zone in which the internal power supply VDD is generated through the path L1. Because the input signal Sin starts to transition from an H level to an L level and the PMOS transistor M1 is going to be turned on, the voltage (denoted by Vn1) at a node n1 illustrated in FIGS. 3 and 4 will rise.

On the other hand, the Zener diode Dz is connected in a direction opposite to the current flowing through the PMOS transistor M1. In the period Ta, the voltage Vn1 is lower than the breakdown voltage (denoted by Vz) of the Zener diode Dz.

Therefore, the node n1 is in a diode-clamped state and the depletion MOS transistor Md is not energized (non-conductive) and thus the voltage (denoted by Vn2) at the node n2 illustrated in FIGS. 3 and 4 is equal to the voltage Vn1.

Accordingly, the source of the PMOS transistor M2 connected to the node n1 and the gate of the PMOS transistor M2 connected to the node n2 have the same potential and therefore the PMOS transistor M2 is turned off.

Once the PMOS transistor M2 is turned off, the potential of GND1 is applied to the gate of the PMOS transistor M3. Accordingly, the gate potential of the PMOS transistor M3 is lower than the source potential of the PMOS transistor M3 and therefore the PMOS transistor M3 is turned on.

On the other hand, the source of the NMOS transistor M4 is electrically connected to the node n1 because the PMOS transistor M3 is turned on. Accordingly, the source potential of the NMOS transistor M4 is substantially the same as the voltage Vn1 (i.e., is also the same potential as the voltage Vn2 of the node n2).

Accordingly, the NMOS transistor M4 is turned off because the gate of the NMOS transistor M4 and the source of the NMOS transistor M4 have the same potential.

Accordingly, the current output from the PMOS transistor M1 flows through the path L1 illustrated in FIG. 3 to generate the internal power supply VDD, and then the internal power supply VDD will be output from the internal power supply output terminal VDDout.

Note that, as the PMOS transistor M1 approaches a full-on state, the output voltage (voltage Vn1 at the node n1) of the PMOS transistor M1 will gradually approach the power supply voltage VCC, and therefore the internal power supply VDD will rise in the period Ta.

[$T2 \leq T < T3$] A period Tb is a time zone in which the internal power supply VDD is generated through the path L2. The internal power supply VDD rises and reaches a value of the breakdown voltage Vz of the Zener diode Dz. Because this means that the voltage Vn2 on the cathode side of the Zener diode Dz reaches the breakdown voltage Vz, the Zener diode Dz will start to break down (the diode-clamp is released).

Once the Zener diode Dz breaks down, the depletion MOS transistor Md will be energized (conductive) and a current will flow in the direction of the anode from the cathode of the Zener diode Dz.

That is, the current output from the PMOS transistor M1 will flow via the depletion MOS transistor Md and Zener diode Dz.

At this time, a potential difference is generated between the voltage Vn1 at the node n1 and the voltage Vn2 at the node n2 and the voltage Vn1 is higher than the voltage Vn2 (Vn2<Vn1). Accordingly, the PMOS transistor M2 is turned on because the gate potential of the PMOS transistor M2 is lower than the source potential of the PMOS transistor M2.

Once the PMOS transistor M2 is turned on, a high potential is applied to the gate of the PMOS transistor M3 and therefore the PMOS transistor M3 is turned off.

On the other hand, the voltage Vn2 is applied to the gate of the NMOS transistor M4 but is higher than the source potential of the NMOS transistor M4, and therefore the NMOS transistor M4 is turned on.

Accordingly, the current output from the PMOS transistor M1 flows through the path L2 illustrated in FIG. 4 to generate the internal power supply VDD, and the internal power supply VDD will be output from the internal power supply output terminal VDDout.

Note that, in the period Tb, the internal power supply VDD will keep the value of voltage V1 until the breakdown of the Zener diode Dz is removed. This voltage V1 is a voltage value obtained by subtracting the threshold voltage of the NMOS transistor M4 from the power supply voltage VCC.

[$T3 \leq T < T4$] A period Tc is a time zone in which the path switches from the path L2 to the path L1 to generate the internal power supply VDD through the path L1 again.

Because the internal power supply VDD serves as an operating power supply for the charge pump 101, the charge pump 101 starts to operate at this instance. Once the charge pump 101 operates, a switch control signal to turn on/off a main switch for driving the load 2 is output.

Because the charge pump 101 operates in this manner, the voltage at the output terminal OUT connected to the load 2 will also rise and thus the voltage on the anode side of the Zener diode Dz will rise and the breakdown of the Zener diode Dz will be removed.

Once the breakdown of the Zener diode Dz is removed, the diode clamp is generated again and thus the path for generating the internal power supply becomes the path L1.

That is, once the breakdown of the Zener diode Dz is removed, the depletion MOS transistor Md becomes non-conductive and therefore the voltage Vn1 at the node n1 and the voltage Vn2 at the node n2 become equal.

Accordingly, the switching operations of the transistors become similar to those in the period Ta, and the internal power supply VDD is generated through the path L1 illustrated in FIG. 3.

[T4≤T] The input signal Sin becomes an L level, the PMOS transistor M1 is fully turned on, and the internal power supply VDD has the same voltage value as the power supply voltage VCC.

Figure 6:
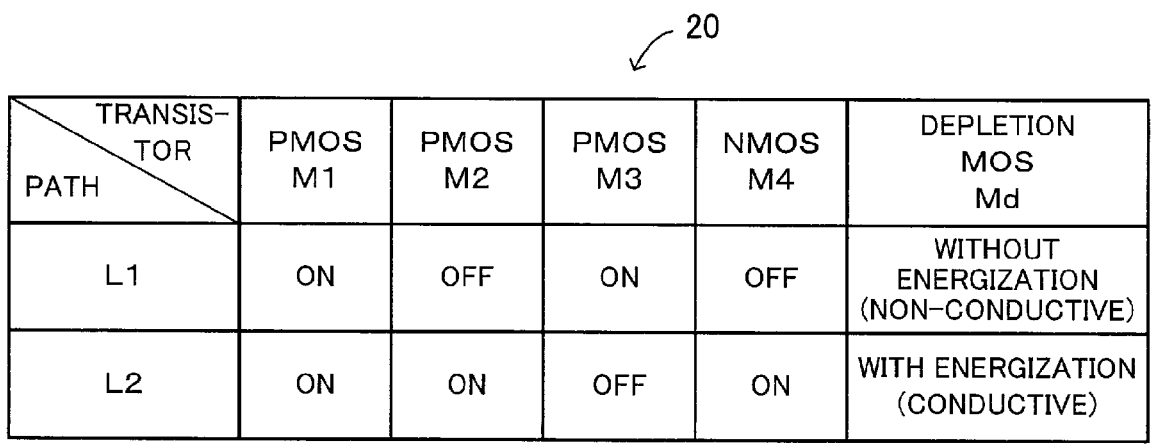
FIG. 6 illustrates an ON or OFF state of each transistor for each path.

Note that a table 20 of FIG. 6 collectively gives the ON or OFF state of each transistor for each of the paths L1 and L2.

Figure 7:
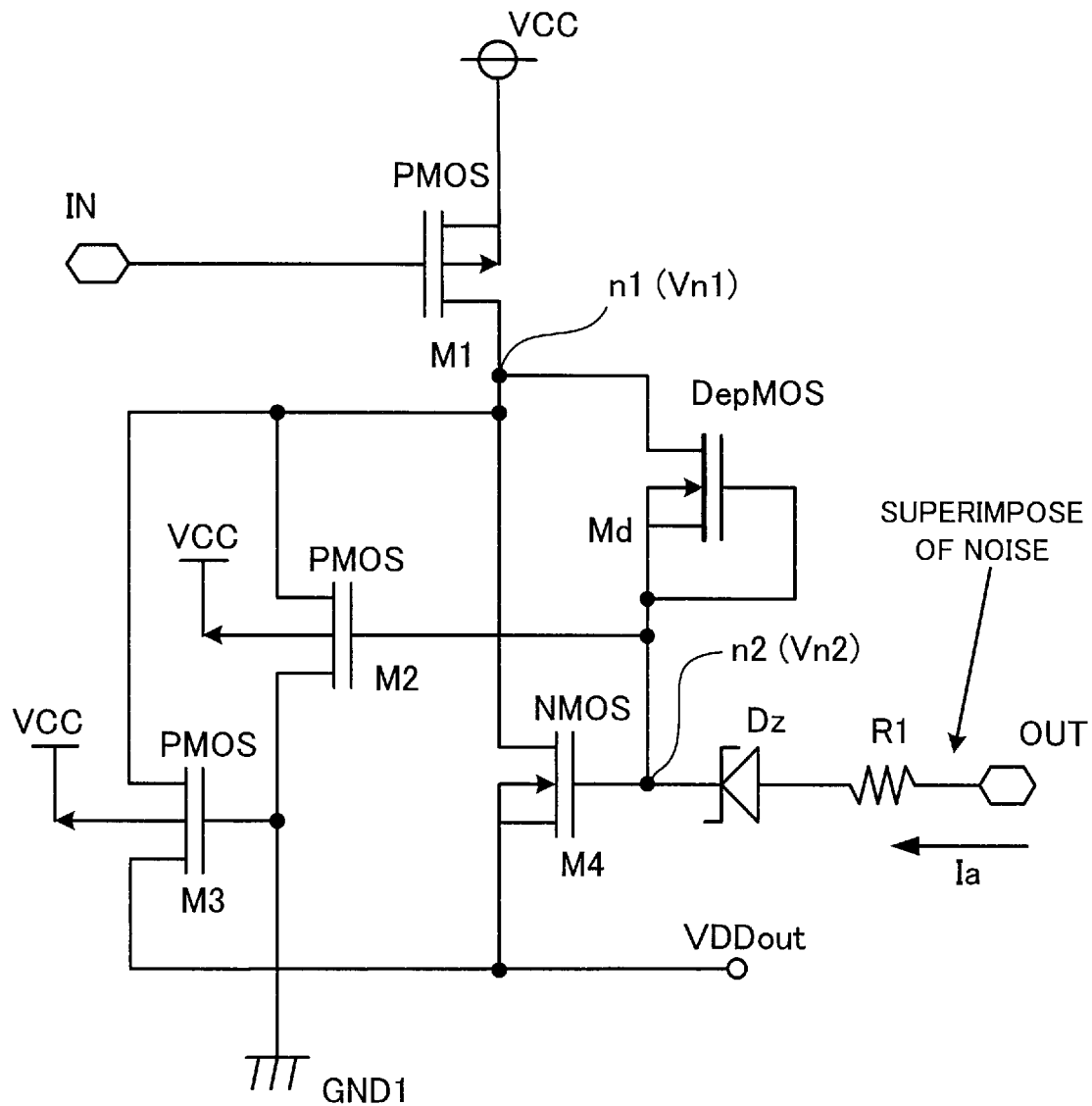
FIG. 7 illustrates a case where an abnormal current is generated in the internal power supply circuit.

Next, the problem to be solved will be described. FIG. 7 illustrates a case where an abnormal current is generated in the internal power supply circuit. Because the internal power supply circuit 10 is directly connected to the load 2 via the output terminal OUT, the output terminal OUT and a transmission line connected to the output terminal OUT are likely to be affected by an external noise.

When the periphery of the output terminal OUT is affected by an external noise, a reverse current Ia might flow through the resistor R1 connected to the Zener diode Dz, and at this time, a reverse voltage across the resistor R1 will be generated. If the reverse voltage is denoted by Va, then Va=Ia×R1.

Once such a state occurs, the voltage on the cathode side of the Zener diode Dz will increase by Va. Therefore, even if the charge pump 101 operates and the voltage at the output terminal OUT connected to the load 2 rises, the voltage on the cathode side of the Zener diode Dz continues to be higher than the breakdown voltage, so that the breakdown of the Zener diode Dz will not be removed. Unless the breakdown of the Zener diode Dz is removed, the transition between paths for stepwisely generating the internal power supply performed at the normal time will not be performed.

Figure 8:
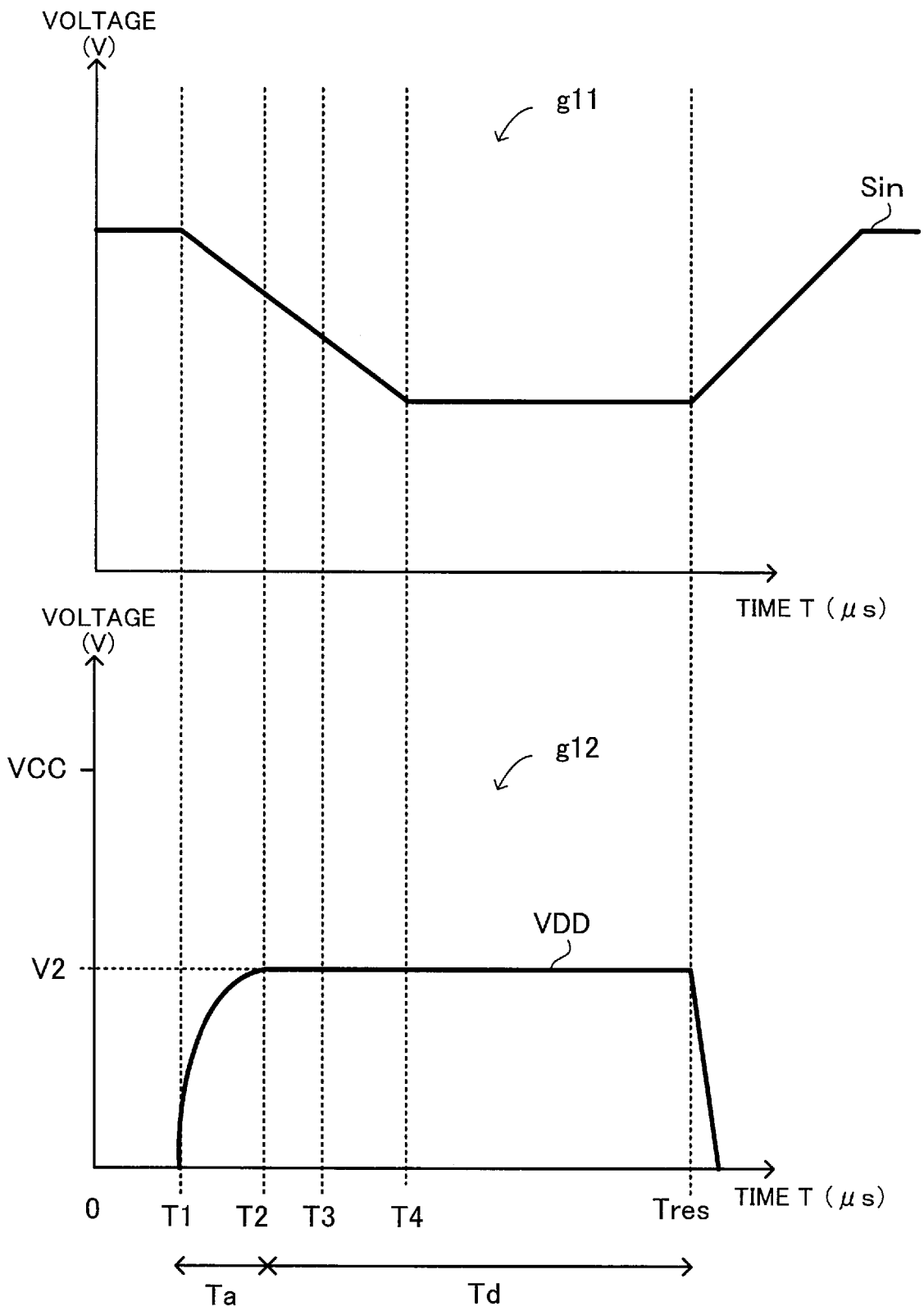
FIG. 8 illustrates a change in the waveform of the internal power supply.

FIG. 8 illustrates a change in the waveform of the internal power supply, and illustrates the operation waveforms at the abnormal time of the internal power supply circuit 10.

A graph g11 illustrates the waveform of the input signal Sin. The vertical axis represents voltage (V) of the input signal Sin, while the horizontal axis represents time T (μs).

Moreover, a graph g12 illustrates the waveform of the internal power supply VDD output from the internal power supply output terminal VDDout. The vertical axis represents voltage (V) of the internal power supply VDD, while the horizontal axis represents time T (μs).

[0≤T<T1] The input signal Sin is at an H level. Accordingly, the PMOS transistor M1 is turned off and the internal power supply VDD becomes 0 V.

[T1≤T<T2] The period Ta is a period during which the internal power supply VDD is generated through the path L1. Note that, because the switching operation of each transistor is the same as that in FIG. 5, the description thereof is omitted.

[T2≤T<Tres] In a period Td, the output terminal OUT is affected by an external noise and a reverse voltage Va is generated across the resistor R1 connected to the Zener diode Dz.

Once the reverse voltage Va is generated across the resistor R1, then the voltage at the output terminal OUT will not be raised and thus the internal power supply VDD will maintain a voltage V2(=V1+Va) of a value obtained by adding the reverse voltage to the voltage V1 generated through the path L2.

Therefore, the potential on the cathode side of the Zener diode Dz continues to be higher than the breakdown voltage, and therefore the breakdown of the Zener diode Dz will not be removed and the transition between paths for stepwisely generating the internal power supply performed at the normal operation time will not be performed (transition to the path L1 is not performed).

[Tres≤T] If the internal power supply VDD does not reach the power supply voltage VCC in a predetermined time, reset is applied from a host device to the internal power supply circuit 10. This example illustrates a case where reset is applied at the time instance Tres, and thus the internal power supply VDD is reset to be 0 V. Moreover, the input signal Sin also transitions from an L level to an H level.

As described above, in the internal power supply circuit 10, once an abnormal current is generated, for example, due to a noise superimposed on the output terminal OUT connected to the load 2, the internal power supply VDD will not be normally increased up to a specified level. If such phenomenon occurs, a leakage current will be generated to cause a malfunction of circuit.

Note that, with a method employing an RC filter such as the above-described conventional technique (Japanese Laid-open Patent Publication No. 09-271165), the ESD (Electro Static Discharge) tolerance between the output terminal and the GND terminal might decrease because a capacitor is connected between the output terminal of a switching element and GND. Moreover, a capacitor with a large area is most likely to be requested in accordance with setting of an RC time constant, and the mounting scale may significantly increase.

In view of the above, there are provided an internal power supply circuit and semiconductor device capable of accurately generating an internal power supply and preventing the malfunction of a circuit without reducing the ESD tolerance and without significantly increasing the mounting scale.

Figure 9:
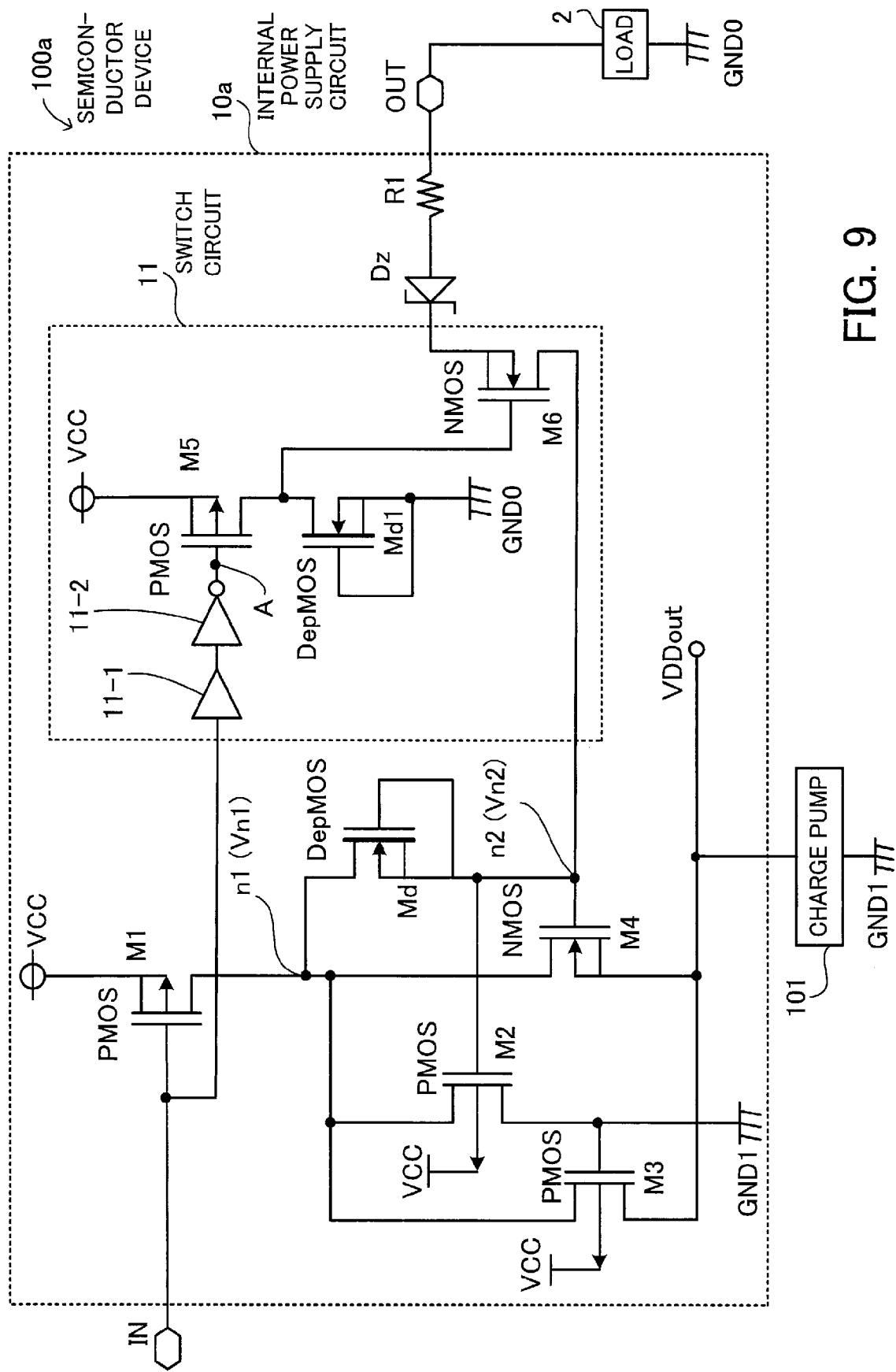
FIG. 9 illustrates a configuration example of a semiconductor device.

Next, an internal power supply circuit of the technique of the embodiments will be described. FIG. 9 illustrates a configuration example of a semiconductor device. A semiconductor device 100a includes an internal power supply circuit 10a and the charge pump 101.

Moreover, the internal power supply circuit 10a includes a switch circuit 11, the PMOS transistors M1 to M3, the NMOS transistor M4, the depletion MOS transistor Md, the Zener diode Dz, and the resistor R1.

Furthermore, the switch circuit 11 includes a delay element 11-1, a delay element 11-2 (with an inverted output), a PMOS transistor M5, a depletion MOS transistor Md1, and an NMOS transistor M6.

The semiconductor device 100a additionally includes the switch circuit 11 with respect to the configuration of FIG. 2, and the other components are the same as in FIG. 2.

Note that, for the correspondence with FIG. 1A, the control switch s0 corresponds to the PMOS transistor M1, the switch s1 corresponds to the PMOS transistor M2, the switch s2 corresponds to the PMOS transistor M3, and the switch s3 corresponds to the NMOS transistor M4.

Moreover, the current control element 1b corresponds to the depletion MOS transistor Md, and the switch circuit 1d corresponds to the switch circuit 11.

The clamp circuit 1a is realized with the Zener diode Dz and the resistor R1.

Regarding the relation of connection of the switch circuit 11, the input end of the delay element 11-1 is connected to the input terminal IN and the gate of the PMOS transistor M1. The output end of the delay element 11-1 is connected to the input end of the delay element 11-2, and the output end of the delay element 11-2 is connected to the gate of the PMOS transistor M5.

The source of the PMOS transistor M5 is connected to the power supply voltage VCC, and the drain of the PMOS transistor M5 is connected to the drain of the depletion MOS transistor Md1 and the gate of the NMOS transistor M6.

The gate of the depletion MOS transistor Md1 is connected to the source of the depletion MOS transistor Md1 and GND0. The drain of the NMOS transistor M6 is connected to the gate of the NMOS transistor M4, the gate of the PMOS transistor M2, the gate of the depletion MOS transistor Md, and the source of the depletion MOS transistor Md. The source of the NMOS transistor M6 is connected to the cathode of the Zener diode Dz. The relation of connection among the other elements is the same as that in FIG. 2.

Figure 10:
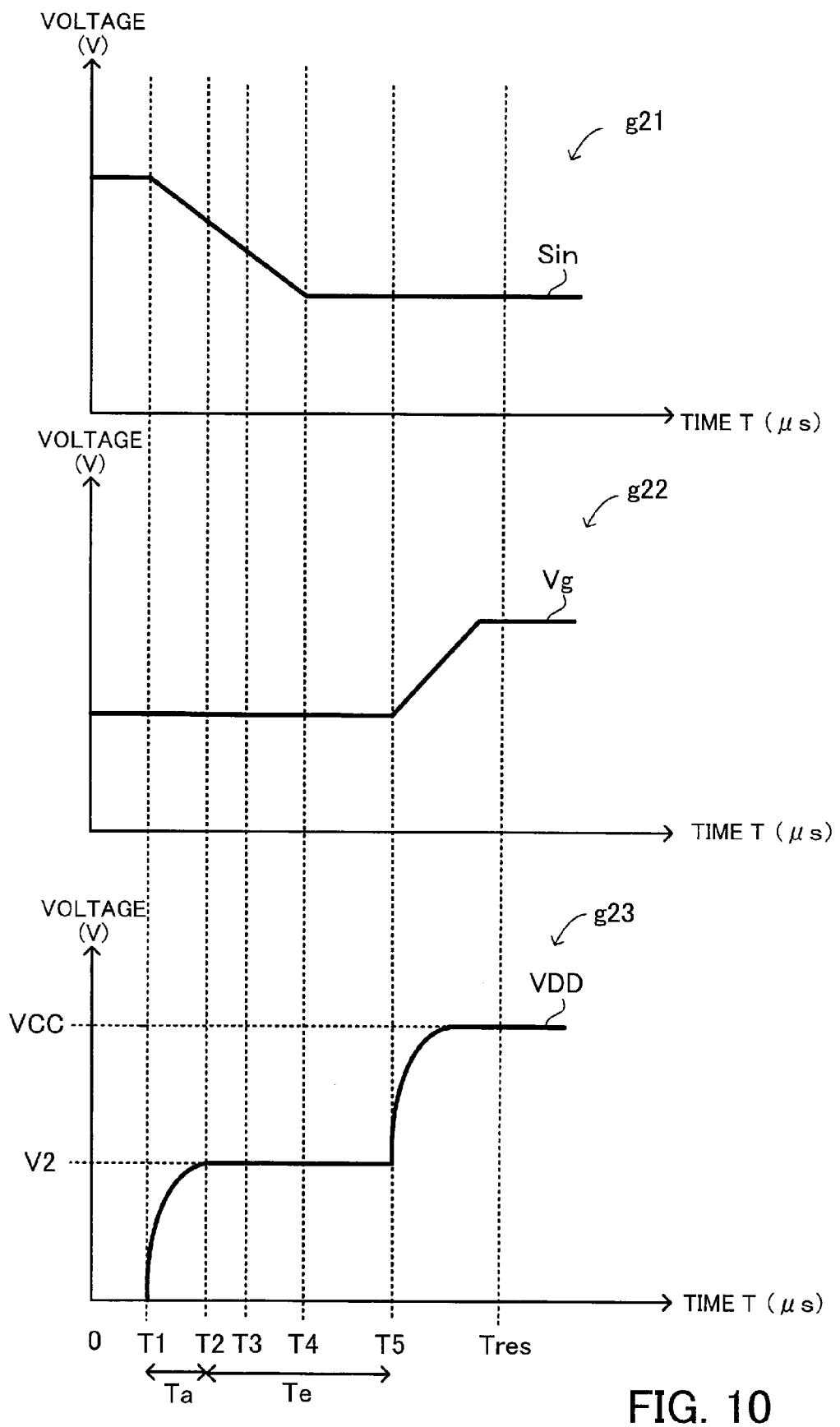
FIG. 10 illustrates a change in the waveform of the internal power supply.

The operation of the semiconductor device 100a will be described. FIG. 10 illustrates a change in the waveform of the internal power supply. A graph g21 illustrates the waveform of the input signal Sin. The vertical axis represents voltage (V) of the input signal Sin, while the horizontal axis represents time T (μs).

Moreover, a graph g22 illustrates the waveform of a voltage Vg of the gate (at a point A illustrated in FIG. 9) of the PMOS transistor M5. The vertical axis represents a gate voltage Vg (V) while the horizontal axis represents time T (μs).

Furthermore, a graph g23 illustrates the waveform of the internal power supply VDD output from the internal power supply output terminal VDDout. The vertical axis represents voltage (V) of the internal power supply VDD, while the horizontal axis represents time T (μs).

[$0 \leq T < T1$] The input signal Sin is at an H level. Accordingly, the PMOS transistor M1 is turned off and the internal power supply VDD becomes 0 V. Moreover, because the gate voltage Vg is at an L level, the PMOS transistor M5 is turned on and the NMOS transistor M6 is turned on. Accordingly, the node n2 and the cathode of the Zener diode Dz are electrically connected.

[$T1 \leq T < T2$] The period Ta is a period during which the internal power supply VDD is generated through the path L1. Note that, because the gate voltage Vg is at an L level, the node n2 and the cathode of the Zener diode Dz are electrically connected.

[$T2 \leq T < T5$] In a period Te, the breakdown of the Zener diode Dz is not removed. Note that, because the gate voltage Vg is at an L level, the node n2 and the cathode of the Zener diode Dz are electrically connected.

As described above, once the output terminal OUT is affected by an external noise and the reverse voltage Va is generated across the resistor R1 connected to the Zener diode Dz, the voltage of the output terminal OUT will not be raised. In this case, the internal power supply VDD will maintain the voltage V2 (=V1+Va) of a value obtained by adding the reverse voltage to the voltage V1.

[$T5 \leq T$] At a time instance T, the gate voltage Vg transitions to an H level. Accordingly, the PMOS transistor M5 is turned off and the NMOS transistor M6 is turned off, and therefore the node n2 and the cathode of the Zener diode Dz are not electrically connected.

That is, because the node n2 is disconnected from the Zener diode Dz and output terminal OUT, the depletion MOS transistor Md becomes non-conductive.

Then, because the voltage Vn1 at the node n1 and the voltage Vn2 at the node n2 become equal, the switching operations of the transistors are the same as those in the period Ta, and the internal power supply VDD is generated through the path L1 illustrated in FIG. 3. Thus, the internal power supply VDD may reach the power supply voltage VCC.

Note that, the delay time set in the delay elements 11-1 and 11-2 is a time period (Ta+Te) in this example. With such delay setting, the PMOS transistor M5 inside the switch circuit 11 is turned off at the time instance T5 after the predetermined time (Ta+Te) has elapsed from the switch-on start time instance T1 of the PMOS transistor M1, and therefore the NMOS transistor M6 is turned off and the node n2 and the cathode of the Zener diode Dz are not electrically connected.

As described above, with the configuration of the semiconductor device 100a, after a predetermined time has elapsed from the switch-on start time instance of the PMOS transistor M1, the internal power supply through the path L1 may be reliably generated before the time instance Tres is reached. This allows the internal power supply to be normally increased up to the power supply voltage VCC and may prevent a malfunction.

Figure 11:
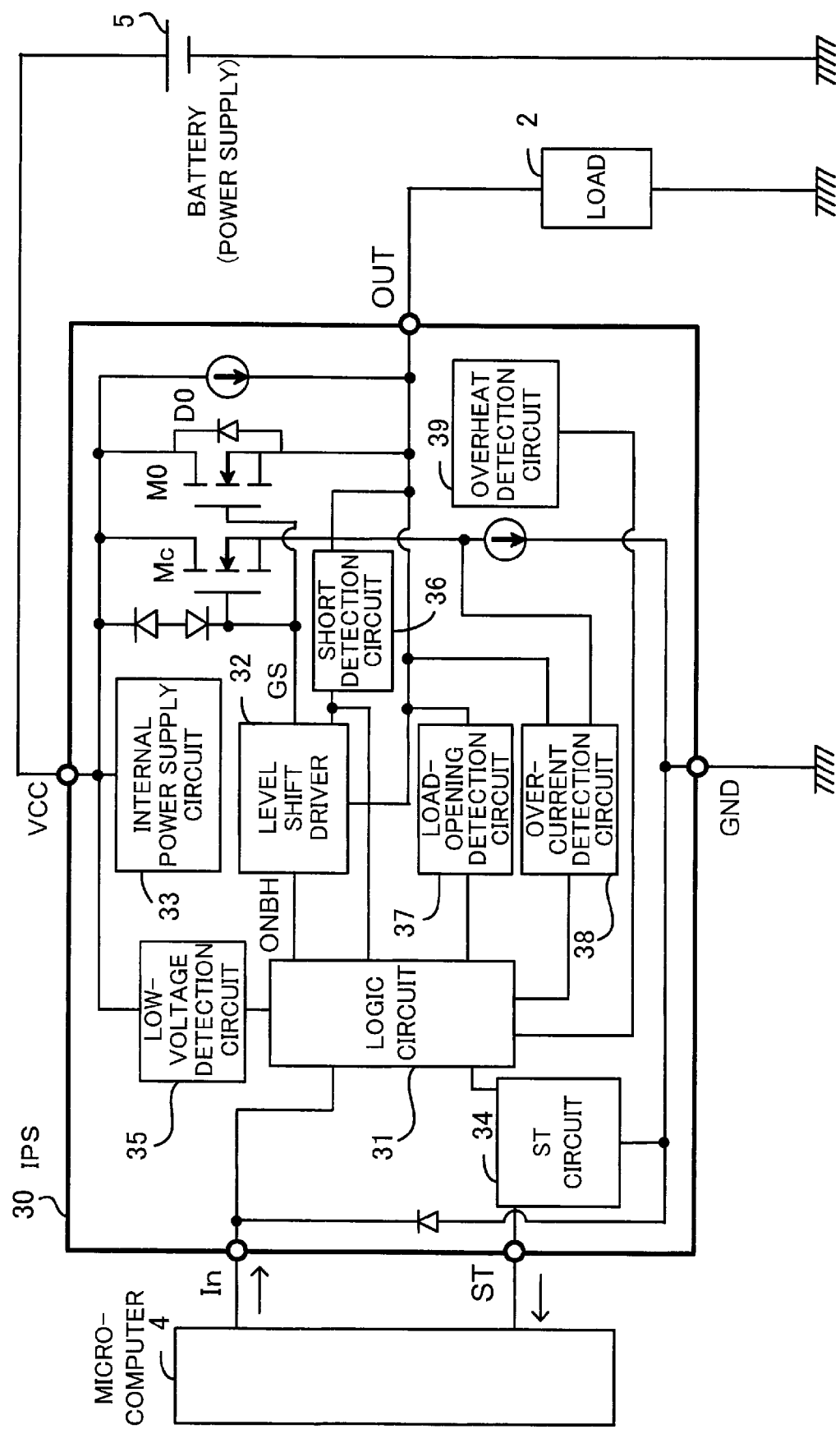
FIG. 11 illustrates a configuration example of a high-side IPS.

Next, the configuration of an IPS to which the semiconductor device 100a of the embodiment is applied will be described. FIG. 11 illustrates a configuration example of a high-side IPS.

An IPS 30 is connected to the load 2, a microcomputer 4, and a battery 5. Moreover, the IPS 30 includes a logic circuit 31, a level shift driver 32, an internal power supply circuit 33, an ST (status) circuit 34, a low-voltage detection circuit 35, a short detection circuit 36, a load-opening detection circuit 37, an overcurrent detection circuit 38, and an overheat detection circuit 39.

Furthermore, the IPS 30 includes a switch element M0 for driving the load 2, and the switch element M0 has a diode D0 (FWD: Free Wheel Diode) connected thereto.

At the moment that the switch element M0 is turned off, a counter-electromotive force is generated from the inductive load 2, such as a motor. Therefore, the diode D0 is connected in antiparallel with the switch element M0 to re-circulate the load current at this time.

Here, the logic circuit 31 collectively recognizes a control signal from the microcomputer 4, the control signal being input from a terminal In, and a state detection signal of each detection circuit, and outputs an ONBH (ON By H) signal for controlling the switch element M0.

The level shift driver 32 boosts the ONBH signal output from the logic circuit 31 to a level for fully turning on the switch element M0 to generate a GS signal, and applies the GS signal to the gate of the switch element M0. Note that the level shift driver 32 has the functions of the above-described charge pump 101.

The internal power supply circuit 33 generates an internal power supply which is a power supply voltage for step-wisely increasing an output voltage from a value lower than the VCC voltage, and supplies the internal power supply to a circuit which needs to be controlled under the internal power supply. Note that the internal power supply circuit 33 includes the function of the internal power supply circuit 10a illustrated in FIG. 9.

The ST circuit 34 transmits a signal indicative of an operation state of the switch element M0 to the microcomputer 4 via an ST terminal.

The low-voltage detection circuit 35 transmits an abnormal signal to the logic circuit 31 when the VCC voltage is lower than a rated voltage. The logic circuit 31, which has received the abnormal signal transmitted from the low-voltage detection circuit 35, turns the ONBH signal for controlling the switch element M0 into a turn-off signal and outputs the same.

The short detection circuit 36 transmits an abnormal signal to the logic circuit 31 when the output terminal OUT connected to the source of the switch element M0 is shorted to GND. The logic circuit 31, which has received the abnormal signal transmitted from the short detection circuit 36, turns the ONBH signal for controlling the switch element M0 into a turn-off signal and outputs the same.

The load-opening detection circuit 37 transmits an abnormal signal to the logic circuit 31 when the output terminal OUT connected to the source of the switch element M0 is opened. The logic circuit 31, which has received the abnormal signal transmitted from the load-opening detection circuit 37, turns the ONBH signal for controlling the switch element M0 into a turn-off signal and outputs the same.

The overcurrent detection circuit 38 receives a current identical to the current flowing through the switch element M0, from a transistor Mc which constitutes a current mirror circuit together with the switch element M0. Then, upon detection of the flowing of an abnormal current larger than the rated current, the overcurrent detection circuit 38 transmits an abnormal signal to the logic circuit 31. The logic circuit 31, which has received the abnormal signal transmitted from the overcurrent detection circuit 38, turns the ONBH signal for controlling the switch element M0 into a turn-off signal and outputs the same.

The overheat detection circuit 39 transmits an abnormal signal to the logic circuit 31 when the switch element M0 reaches an abnormal temperature higher than a rated temperature. The logic circuit 31, which has received the abnormal signal transmitted from the overheat detection circuit 39, turns the ONBH signal for controlling the switch element M0 into a turn-off signal and outputs the same.

As described above, according to the embodiments, even if an abnormal current is generated due to noise superimposed on a transmission line connected to a load, an internal power supply may be accurately increased up to a power supply voltage.

This may suppress the generation of a leakage current during turning on of a switching element without reducing the ESD tolerance and without significantly increasing the area of an integrated circuit, and may prevent a malfunction, such as a case where a switch element is not fully turned on due to an external noise.

According to an aspect, it is possible to increase the accuracy in generating an internal power supply and prevent a malfunction of a circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An internal power supply circuit which generates an internal power supply from a power supply voltage, the internal power supply circuit comprising:
   a control switch which is connected to the power supply voltage and turns on based on a control signal to output a current;
   a clamp circuit which is connected to a load and carries out clamp control of an output voltage of the control switch;
   a current control element which conducts or shuts off the current in accordance with the output voltage to be clamp-controlled;
   a selector switch group which performs switching between paths for generating the internal power supply, based on an application of a voltage varying with conduction or shut-off of the current; and
   a switch circuit which connects or disconnects a coupling between the clamp circuit and the selector switch group.

2. The internal power supply circuit according to claim 1, wherein the selector switch group performs switching between a first path for generating the internal power supply without a specified level of voltage drop from the power supply voltage and a second path for generating the internal power supply with the specified level of voltage drop from the power supply voltage, and
   wherein the switch circuit performs switching to the first path by disconnecting the coupling after a predetermined time has elapsed from start of switch-on of the control switch.

3. The internal power supply circuit according to claim 2, wherein the selector switch group includes a three-terminal switch having a first switch, a second switch, and a third switch,
   wherein an input terminal to receive the control signal is connected to an input end of the control switch and one input end of the switch circuit,
   wherein a current output end of the control switch is connected to an input end of each of the first, second, and third switches and to an input end of the current control element,
   wherein an output end of the current control element is connected to another input end of each of the first and third switches and to another input end of the switch circuit,
   wherein an output end of the first switch is connected to another input end of the second switch and an internal ground,
   wherein an output end of each of the second and third switches is connected to an internal power supply output terminal,
   wherein an output end of the switch circuit is connected to an input end of the clamp circuit, and
   wherein an output end of the clamp circuit is connected to one end of the load, and another end of the load is connected to an external ground.

4. The internal power supply circuit according to claim 3, wherein when the output voltage is less than a predetermined voltage, the output voltage is clamped by the clamp circuit and the current control element becomes non-conductive, the first switch is turned off, the second switch is turned on and the third switch is turned off, and the first path, which goes from the control switch to the internal power supply output terminal via the second switch, is generated to output the internal power supply,
   wherein when the output voltage is not less than a predetermined voltage, clamping of the output voltage is released by the clamp circuit and the current control element conducts, the first switch is turned on, the second switch is turned off, and the third switch is turned on, and the second path, which goes from the control switch to the internal power supply output terminal via the third switch, is generated to output the internal power supply, and
   wherein after a predetermined time has elapsed from start of switch-on of the control switch, the coupling is disconnected by the switch circuit, so that the current control element becomes non-conductive and the first path is generated to output the internal power supply.

5. A semiconductor device comprising:

a charge pump which uses, as an operating power supply, an internal power supply generated from a power supply voltage and performs a boosting operation for driving a load; and an internal power supply circuit including: a control switch which is connected to the power supply voltage and turns on based on a control signal to output a current; a clamp circuit which is connected to the load and carries out clamp control of an output voltage of the control switch; a current control element which conducts or shuts off the current in accordance with the output voltage to be clamp-controlled; a selector switch group which performs switching between paths for generating the internal power supply, based on an application of a voltage varying with conduction or shut-off of the current; and a switch circuit which connects or disconnects a coupling between the clamp circuit and the selector switch group.

* * * * *